(12) United States Patent
Lee

(10) Patent No.: US 11,729,962 B2
(45) Date of Patent: Aug. 15, 2023

(54) MEMORY DEVICE

(71) Applicant: SK hynix Inc., Gyeonggi-do (KR)

(72) Inventor: Ki Hong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 229 days.

(21) Appl. No.: 17/166,437

(22) Filed: Feb. 3, 2021

(65) Prior Publication Data

US 2022/0077151 A1 Mar. 10, 2022

(30) Foreign Application Priority Data

Sep. 4, 2020 (KR) ........................ 10-2020-0113116

(51) Int. Cl.
*H01L 27/108* (2006.01)
*H10B 12/00* (2023.01)
*H01L 29/06* (2006.01)
*H01L 29/786* (2006.01)
*H01L 29/423* (2006.01)
*H01L 49/02* (2006.01)

(52) U.S. Cl.
CPC ............ *H10B 12/30* (2023.02); *H01L 28/40* (2013.01); *H01L 29/0673* (2013.01); *H01L 29/0684* (2013.01); *H01L 29/42392* (2013.01); *H01L 29/7869* (2013.01); *H01L 29/78654* (2013.01); *H01L 29/78672* (2013.01); *H01L 29/78696* (2013.01); *H10B 12/03* (2023.02); *H10B 12/05* (2023.02); *H10B 12/48* (2023.02); *H10B 12/482* (2023.02); *H10B 12/50* (2023.02); *H10B 12/485* (2023.02); *H10B 12/488* (2023.02)

(58) Field of Classification Search
CPC ......... H01L 21/10805; H01L 21/10847; H01L 21/1085; H01L 21/10873; H01L 21/10882; H01L 21/10885; H01L 21/10888; H01L 21/10891; H01L 21/10897; H01L 28/40; H01L 28/60; H01L 29/0673; H01L 29/0684; H01L 29/42392; H01L 29/78654; H01L 29/78672; H01L 29/7869; H01L 29/78696; B82Y 10/00; B82Y 40/00; H10B 12/03; H10B 12/05; H10B 12/48; H10B 12/482; H10B 12/485; H10B 12/488; H10B 12/50
See application file for complete search history.

(56) References Cited

U.S. PATENT DOCUMENTS 7,141,837 B2 11/2006 Coronel et al.
2019/0103407 A1 4/2019 Kim et al.

*Primary Examiner* — Cheung Lee
(74) *Attorney, Agent, or Firm* — IP & T Group LLP

(57) ABSTRACT

A memory cell comprising a substrate, a bit line vertically oriented from the substrate along a first direction, a nanosheet transistor including at least one nanosheet horizontally oriented from the bit line along a second direction perpendicular to the first direction, and a capacitor horizontally oriented from the nanosheet transistor along the second direction.

32 Claims, 10 Drawing Sheets

MEMORY DEVICE

CROSS-REFERENCE TO RELATED APPLICATIONS

The present application claims priority to Korean Patent Application No. 10-2020-0113116, filed on Sep. 4, 2020, which is herein incorporated by reference in its entirety.

BACKGROUND

1. Field

The disclosure relates to semiconductor devices and, more particularly, to memory devices with enhanced e integration.

2. Description of the Related Art

The degree of integration of a two-dimensional (2D) semiconductor device is mainly determined by the area occupied by the memory cell and is thus greatly influenced by the level of fine pattern formation technology. Hence, though the degree of integration of 2D semiconductor devices has been increasing, it is limited by advances made in the ultra-high-priced equipment required for miniaturization of patterns. To overcome this limitation of 2D devices, memory devices with memory cells arrayed in three dimensions (3D) have been proposed.

SUMMARY

According to various embodiments of the present disclosure, there are provided 3D memory cells and memory devices with higher integration.

According to an embodiment of the present disclosure, a memory cell comprises a substrate, a bit line vertically oriented from the substrate along a first direction, a nanosheet transistor including at least one nanosheet horizontally oriented from the bit line along a second direction perpendicular to the first direction, and a capacitor horizontally oriented from the nanosheet transistor along the second direction.

According to an embodiment of the present disclosure, a memory cell comprises a substrate, a bit line vertically oriented from the substrate along a first direction, a first cylinder horizontally oriented from the bit line along a second direction perpendicular to the first direction, a second cylinder horizontally spaced apart from the first cylinder, at least two nanosheets horizontally oriented between the first cylinder and the second cylinder, a word line buried in the first cylinder and the second cylinder while surrounding the at least two nanosheets, and a capacitor horizontally oriented from the second cylinder along the second direction.

According to an embodiment of the present disclosure, a memory cell comprises a substrate, a bit line vertically oriented from the substrate along a first direction, at least two nanosheets horizontally oriented from the bit line along a second direction perpendicular to the first direction, a word line including a surrounding portion surrounding the at least two nanosheets and a first buried portion and a second buried portion extending from the surrounding portion along the second direction, a first doped portion horizontally oriented from a first side of the nanosheets, connected to the bit line, and surrounding the first buried portion, a second doped portion horizontally oriented from a second side of the nanosheets and surrounding the second buried portion, and a capacitor horizontally oriented from the second doped portion along the second direction.

According to an embodiment of the present disclosure, a memory device comprises a peripheral circuit portion and a memory cell array including a plurality of memory cells vertically arrayed along a first direction from the peripheral circuit portion, wherein each of the plurality of memory cells includes a bit line vertically oriented along the first direction, a nanosheet transistor including at least two nanosheets horizontally oriented from the bit line along a second direction perpendicular to the first direction, and a capacitor horizontally oriented from the nanosheet transistor along the second direction.

According to the present disclosure, in the memory device, transistors and capacitors may be stacked in 3D on a substrate. Thus, the memory device may have an increased degree of integration.

According to the present disclosure, the word line WL having a gate-all-around structure may electrically shield at least two nanosheets from the word lines of the memory cells vertically neighboring each other.

These and other features and advantages of the invention will become better understood from the following drawings and detailed description of various embodiments of the present disclosure.

DETAILED DESCRIPTION

Figure 1:
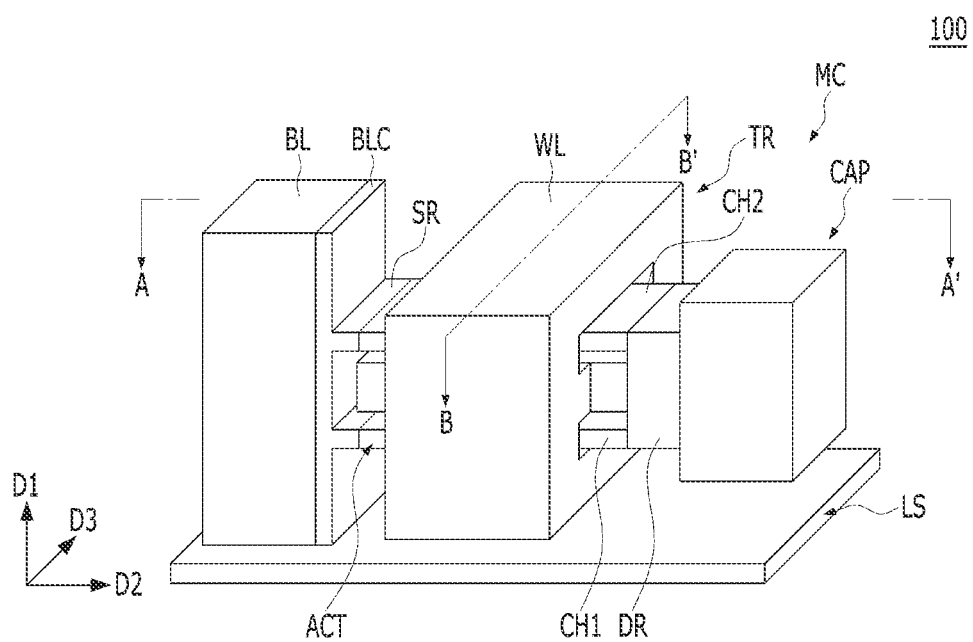
FIG. 1 is a view schematically illustrating a configuration in of a memory device according to an embodiment of the present disclosure.

Hereinafter, embodiments of the present disclosure are described with reference to schematic cross-sectional views, plan views, or block diagrams. Changes or modifications may be made to the views depending on manufacturing techniques and/or tolerances. Thus, the embodiments of the present disclosure are not limited to specific types as shown and illustrated herein but may encompass changes or modifications resultant from fabricating processes. For example, the regions or areas shown in the drawings may be schematically shown, and their shapes shown are provided merely as examples, rather than as limiting the category or scope of the present disclosure.

Figure 2A:
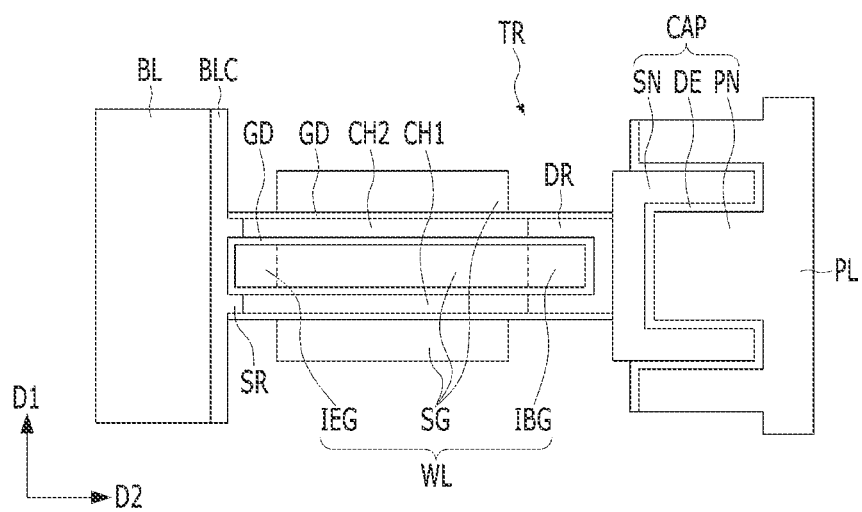
FIG. 2A is a cross-sectional view taken along line A-A' of FIG. 1.
Figure 2B:
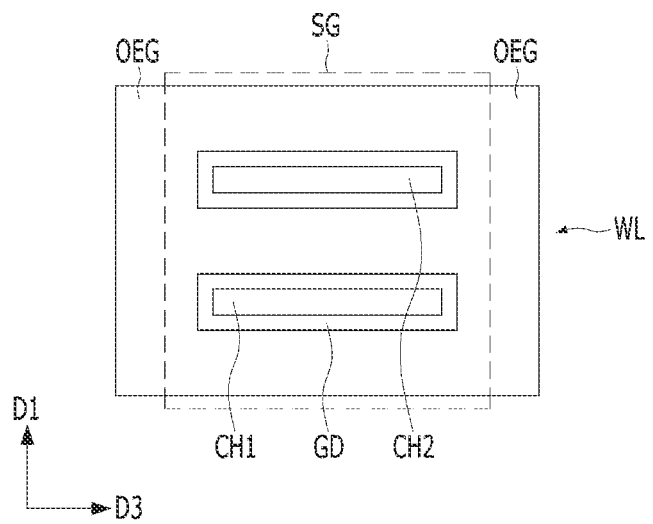
FIG. 2B is a cross-sectional view taken along line B-B' of FIG. 1.
Figure 3:
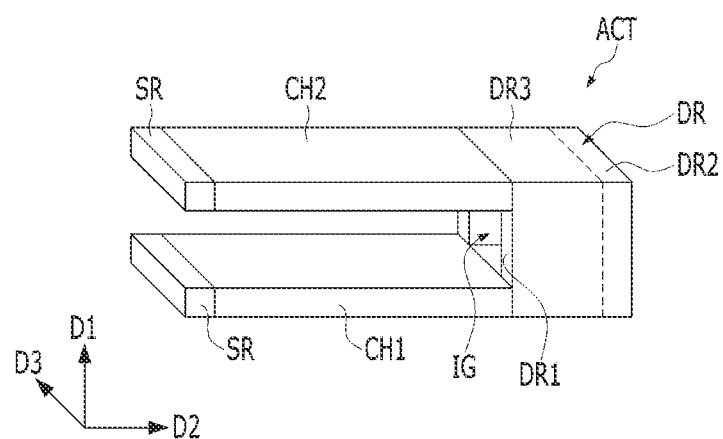
FIG. 3 is a view illustrating, in detail, an active layer ACT of FIG. 1.
Figure 4A:
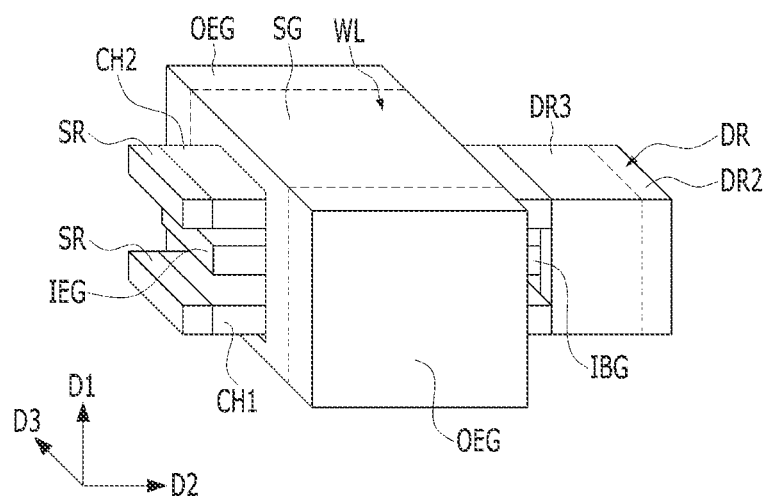
FIGS. 4A and 4B, respectively, are a perspective view and an exploded perspective view illustrating an arrangement of word lines WL and active layers ACT.
Figure 4B:
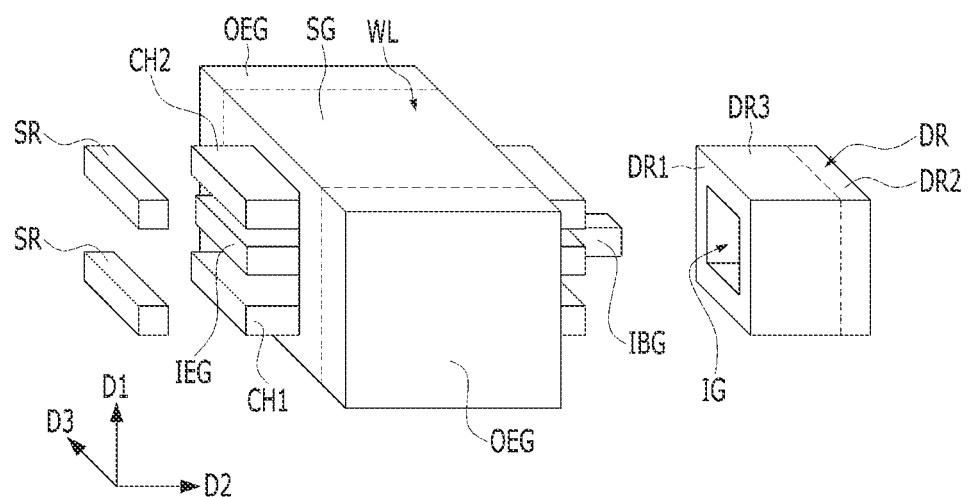

FIG. 1 is a view schematically illustrating a configuration of a memory device according to an embodiment of the present disclosure. FIG. 2A is a cross-sectional view taken along line A-A' of FIG. 1. FIG. 2B is a cross-sectional view taken along line B-B' of FIG. 1. FIG. 3 is a view illustrating, in detail, an active layer ACT of FIG. 1. FIGS. 4A and 4B, respectively, are a perspective view and exploded perspective view illustrating an arrangement of word lines WL and active layers ACT.

Referring to FIGS. 1 to 4B, a memory device 100 may include a memory cell MC. The memory cell MC may be positioned on a substrate structure LS. The memory cell MC may include a bit line BL, a transistor TR, and a capacitor CAP. The bit line BL may be oriented vertically along a first direction D1 from the substrate structure LS. The transistor TR may be oriented horizontally along a second direction D2, which is perpendicular to the first direction D1, from the bit line BL. The capacitor CAP may be oriented horizontally along the second direction D2 from the transistor TR. The transistor TR may include a word line WL horizontally oriented along a third direction D3.

The substrate structure LS may include any material appropriate for semiconductor processing. The substrate structure LS may include at least one or more of a conductive material, a dielectric material, and a semiconductive material. Various materials may be formed on the substrate structure LS. The substrate structure LS may include a semiconductor substrate. The semiconductor substrate may be formed of a material containing silicon. For example, the substrate structure LS may include silicon, monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The substrate structure LS may include other semiconductor material, e.g., germanium. The substrate structure LS may include a compound semiconductor substrate, e.g., a group-III/V semiconductor substrate, such as of GaAs. The substrate structure LS may include a silicon-on-insulator (SOI) substrate.

According to an embodiment, the substrate structure LS may include a semiconductor substrate and a plurality of integrated circuits (ICs), multi-level metal wires (MLM) or a combination thereof, formed on the semiconductor substrate. The substrate structure LS may include a peripheral circuit portion PC. The peripheral circuit portion PC may include a plurality of control circuits for controlling the memory cell MC. The peripheral circuit portion PC may include a sense amplifier (SA) connected to the bit line BL and a sub word line driver connected to the word line WL. The peripheral circuit portion PC is denoted with the reference denotation 'PC' of FIGS. 5A, 6, and 7.

The bit line BL may include a vertically oriented pillar. The bit line BL may include a silicon-based material, a metal-based material, or a combination thereof. The bit line BL may include polysilicon, titanium nitride, tungsten, or a combination thereof. For example, the bit line BL may include polysilicon or titanium nitride (TiN) doped with N-type impurities. The bit line BL may include a stack (TiN/W) of titanium nitride and tungsten. The bit line BL may include a vertically oriented metallic pillar.

The transistor TR may include a lateral transistor. The transistor TR may include a gate-all-around (GAA) transistor. The transistor TR may include an active layer ACT and a word line WL. The active layer ACT may be horizontally oriented along the second direction D2 from the bit line BL. The word line WL may be horizontally oriented along the third direction D3 perpendicular to the first direction D1 and the second direction D2. The active layer ACT may include a first doped portion SR, a second doped portion DR, and at least one channel portion CH1 and CH2. The at least one channel portion CH1 and CH2 may be positioned between the first doped portion SR and the second doped portion DR. The first doped portion SR may provide a first edge of the active layer ACT, and the second doped portion DR may provide a second edge of the active layer ACT. The active layer ACT may include a silicon-containing material. The active layer ACT may include a monocrystalline silicon layer, a polysilicon layer, a doped silicon layer, a doped polysilicon layer, or a combination thereof. The first doped portion SR and the second doped portion DR may include an N-type impurity or a P-type impurity. The first doped portion SR and the second doped portion DR may include phosphorus (P), arsenic (As), boron (B), indium (In), or a combination thereof. The first doped portion SR and the second doped portion DR may be doped with the same impurity. The first doped portion SR and the second doped portion DR may also be referred to as a first source/drain and a second source/drain, respectively. The channel portions CH1 and CH2 may include impurities different from those of the first and second doped portions SR and DR.

The first doped portion SR may be connected to the bit line BL via a bit line contact node BLC positioned between the bit line BL and the first doped portion SR. The bit line contact node BLC and the first doped portion SR may include the same material. For example, the bit line contact node BLC and the first doped portion SR may include doped polysilicon doped, for example, with an N-type impurity. Alternatively, the first doped portion SR may include first doped polysilicon. The bit line contact node BLC may include a stack of second doped polysilicon and metal silicide. The second doped polysilicon may be connected to the first doped portion SR, and the metal silicide may be connected to the bit line BL. According to an embodiment, the bit line contact node BLC and the first doped portion SR may have an integral structure including a single layer of doped polysilicon. The first doped portion SR may be connected to the first edge of the channel portions CH1 and CH2. An ohmic contact layer, such as metal silicide, may be further formed between the bit line BL and the bit line contact node BLC.

The second doped portion DR may be connected to the capacitor CAP. The second doped portion DR may be connected to a storage node SN of the capacitor CAP.

Referring to FIG. 3, the second doped portion DR may include an opened side surface DR1 connected to the channel portions CH1 and CH2. The second doped portion DR may include a closed side surface DR2 connected to the storage node SN of the capacitor. The second doped portion DR may be connected to the second edge of the channel portions CH1 and CH2. The second doped portion DR may be shaped, for example, as a cylinder and may be horizontally oriented along the second direction D2. For example, the opened side surface DR1 of the second doped portion DR may correspond to an entrance of the cylinder, and the closed side surface DR2 of the second doped portion DR may correspond to the bottom of the cylinder. The second doped portion DR may further include an outer wall DR3 between the opened side surface DR1 and the closed side surface DR2. An inner gap IG may be defined by the outer wall DR3 and the closed side surface. The inner gap IG may be referred to as a recess portion.

The channel portions CH1 and CH2 may be horizontally oriented along the second direction D2. The channel portions CH1 and CH2 may be horizontally oriented along the second direction D2, between the first doped portion SR and the second doped portion DR. The channel portions CH1 and CH2 may each be formed as a horizontal flat plate. The length of the channel portions CH1 and CH2, along the second direction D2, may be larger than the length of the channel portions CH1 and CH2, along the third direction D3. The channel portions CH1 and CH2 may also be referred to as nanosheets or nanosheet channels. Since the channel portions CH1 and CH2 are horizontally oriented along the second direction D2, the channel portions CH1 and CH2 may also be referred to as 'lateral nanosheets.' The channel portions CH1 and CH2 may include at least two channel portions, e.g., a first channel portion CH1 and a second channel portion CH2. The first channel portion CH1 and the second channel portion CH2 may be arranged vertically along the first direction D1. The space between the first channel portion CH1 and the second channel portion CH2 may be filled with a portion of the word line WL. The thickness of the first channel portion CH1 may be identical to the thickness of the second channel portion CH2. The thickness refers to a thickness along the first direction D1. The channel portions CH1 and CH2 may include a semiconductor material, a monocrystalline semiconductor material, a polycrystalline semiconductor material, an oxide semiconductor, a metal compound, or a combination thereof. For example, the channel portions CH1 and CH2 may include monocrystalline silicon, polysilicon, silicon germanium, indium gallium zinc oxide (IGZO), $MoS_2$, and $WS_2$.

Referring to FIGS. 2A, 4A and 4B, the word line WL may include a surrounding portion SG surrounding the channel portions CH1 and CH2. The word line WL may further include an inner extension portion (IEG) that horizontally extends from a first side surface of the surrounding portion SG along the second direction D2. The inner extension portion IEG may be positioned near the first doped portion SR. The word line WL may further include an inner buried portion (IBG) that horizontally extends from a second side surface of the surrounding portion SG along the second direction D2. The inner buried portion IBG may fill the inner gap IG of the second doped portion DR. The surrounding portion SG may be referred to as a surrounding gate electrode, and the inner buried portion IBG may be referred to as a buried gate electrode. The inner extension portion IEG and the inner buried portion IBG may be positioned in the space between the first channel portion CH1 and the second channel portion CH2. The surrounding portion SG, the inner extension portion IEG, and the inner buried portion IBG may be integrally formed to be connected with one another. The surrounding portion SG may also be referred to as a gate-all-around (GAA). The length of the surrounding portion SG along the second direction D2 may be larger than the length of the inner extension portion IEG and the inner buried portion IBG along the second direction D2. Alternatively, the length of the surrounding portion SG along the second direction D2 may be identical to the length of the inner extension portion IEG and the inner buried portion IBG along the second direction D2. The word line WL may further include outer extension portions OEG that extend from the surrounding portion SG along the third direction D3. The outer extension portions OEG may not surround the channel portions CH1 and CH2. The inner extension portion IEG and the inner buried portion IBG may not surround the channel portions CH1 and CH2 either. The inner extension portion IEG, inner buried portion IBG, and outer extension portions OEG may be collectively referred to as a 'non-surrounding portion.'

The word line WL may include a hybrid gate-all-around (GAA) structure. The hybrid GAA structure may include the surrounding portion SG and the inner buried portion IBG.

The word line WL may include a silicon-containing material, a metal-containing material, or a combination thereof. The word line WL may include polysilicon, metal, metal silicide, metal nitride, or a combination thereof. For example, the word line WL may include a stack of titanium nitride and tungsten.

Referring back to FIGS. 2A and 2B, a gate insulation layer GD may be formed between the word line WL and the channel portions CH1 and CH2. A portion of the gate insulation layer GD may be formed between the inner buried portion IBG and the second doped portion DR. A portion of the gate insulation layer GD may be formed between the inner extension portion IEG and the first doped portion SR. The gate insulation layer GD may surround the channel portions CH1 and CH2. The surrounding portion SG of the word line WL may surround the channel portions CH1 and CH2, with the gate insulation layer GD disposed therebetween. The gate insulation layer GD may be shaped to conformally surround the channel portions CH1 and CH2. The gate insulation layer GD may include silicon oxide, silicon nitride, silicon oxynitride, high-k material, or a combination thereof.

Referring back to FIGS. 1 and 2A, the capacitor CAP may be horizontally disposed from the transistor TR. The capacitor CAP may be oriented horizontally along the second direction D2. The capacitor CAP may include a storage node SN, a dielectric layer DE, and a plate node PN. The storage node SN, the dielectric layer DE, and the plate node PN may be horizontally arranged along the second direction D2. The storage node SN may be shaped, for example, as a cylinder and may be horizontally oriented, and the plate node PN may be shaped to surround the cylinder of the storage node SN. The dielectric layer DE may be shaped to cover the surface of the cylinder of the storage node SN. The plate node PN may connect to the plate line PL. Alternatively, the plate node PN and the plate line PL may be integrally formed with each other, and the plate node PN may be part of the plate line PL.

The storage node SN may have a three-dimensional (3D) structure, and the 3D structure of the storage node SN may be a horizontal 3D structure along the second direction D2. As an example of the 3D structure, the storage node SN may have a cylinder shape, a pillar shape, or a pylinder shape resultant from merging a pillar shape and a cylinder shape.

In the illustrated embodiment, the storage node SN may be shaped as a cylinder. The dielectric layer DE may be formed between the storage node SN and the plate node PN. The dielectric layer DE may directly contact the plate node PN.

The capacitor CAP may include a metal-insulator-metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide. The silicon oxide ($SiO_2$) may have a dielectric constant of about 3.9, and the dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). Alternatively, the dielectric layer DE may be formed of a composite layer which includes two or more layers of the high-k materials mentioned above.

The dielectric layer DE may be formed of a zirconium-based oxide (Zr-based oxide). The dielectric layer DE may have a stacked structure including a zirconium oxide ($ZrO_2$). The stacked structure including the zirconium oxide ($ZrO_2$) may include a ZA($ZrO_2/Al_2O_3$) stack or a ZAZ($ZrO_2/Al_2O_3/ZrO_2$) stack. The ZA stack may have a stacked structure in which an aluminum oxide $Al_2O_3$ is stacked on a zirconium oxide $ZrO_2$. The ZAZ stack may have a stacked structure in which a zirconium oxide $ZrO_2$, an aluminum oxide $Al_2O_3$, and a zirconium oxide $ZrO_2$ are sequentially stacked. The ZA stack and ZAZ stack may also be referred to as a zirconium oxide-base layer ($ZrO_2$-based layer). According to another embodiment, the dielectric layer DE may form a hafnium-based oxide. The dielectric layer DE may have a stacked structure including a hafnium oxide ($HfO_2$). The stacked structure including the hafnium oxide ($HfO_2$) may include a HA($HfO_2/Al_2O_3$) stack or an HAH ($HfO_2/Al_2O_3/HfO_2$) stack. The HA stack may have a stacked structure in which an aluminum oxide $Al_2O_3$ is stacked on a hafnium oxide $HfO_2$. The HAH stack may have a stacked structure in which a hafnium oxide $HfO_2$, an aluminum oxide $Al_2O_3$, and a hafnium oxide $HfO_2$ are sequentially stacked. The HA stack and HAH stack may also be referred to as a hafnium oxide-base layer ($HfO_2$-based layer). In the ZA stack, ZAZ stack, HA stack, and HAH stack, the aluminum oxide ($Al_2O_3$) may have a larger bandgap than the zirconium oxide ($ZrO_2$) and the hafnium oxide ($HfO_2$). The aluminum oxide ($Al_2O_3$) may have a lower dielectric constant than the zirconium oxide ($ZrO_2$) and the hafnium oxide ($HfO_2$). Thus, the dielectric layer DE may include a stack of the high-k material and a high band gap material which has a larger band gap than the high-k material. The dielectric layer DE may also include a silicon oxide $SiO_2$ as a high band gap material other than the aluminum oxide $Al_2O_3$. As the dielectric layer DE includes a high band gap material, leakage current may be suppressed. The high band gap material may be extremely thin. In an embodiment, the high band gap material may be thinner than the high-k material. A thickness of the high band gap material is in a range of 1 Å to 10 Å. According to another embodiment, the dielectric layer DE may include a laminated structure in which high-k materials and high band gap materials are alternately stacked. For example, the dielectric layer DE may include ZAZA($ZrO_2/Al_2O_3/ZrO_2/Al_2O_3$), ZAZAZ($ZrO_2/Al_2O_3/ZrO_2/Al_2O_3/ZrO_2/Al_2O_3/ZrO_2$), HAHA($HfO_2/Al_2O_3/HfO_2/Al_2O_3$) or HAHAH($HfO_2/Al_2O_3/HfO_2/Al_2O_3/HfO_2$). In the above laminated structure, the aluminum oxide $Al_2O_3$ may be extremely thin, for example, a thickness of the aluminum oxide $Al_2O_3$ is in a range of 1 Å to 10 Å.

According to another embodiment, the dielectric layer DE may include a stacked structure, laminated structure, or mixing structure including zirconium oxide, hafnium oxide, and aluminum oxide.

According to another embodiment, an interface control layer may further be formed between the storage node SN and the dielectric layer DE to mitigate leakage current. The interface control layer may include titanium oxide ($TiO_2$). The interface control layer may also be formed between the plate node PN and the dielectric layer DE.

The storage node SN and the plate node PN may include a metal, precious metal, metal nitride, conductive metal oxide, conductive precious metal oxide, metal carbide, metal silicide, or a combination thereof. For example, the storage node (SN) and the plate node (PN) may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium oxide ($IrO_2$), platinum (Pt), molybdenum (Mo), molybdenum oxide (MoO), titanium nitride/tungsten (TiN/W) stack, or tungsten nitride/tungsten (WN/W). The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, the silicon germanium may be a gap-fill material filling the cylinder of the storage node SN, the titanium nitride (TiN) may substantially play a role as a plate node of the capacitor CAP, and the tungsten nitride may be a low-resistance material.

The plate line PL may be vertically oriented along the first direction D1 while being horizontally oriented along the third direction D3. The plate line PL may be shaped as a vertical flat plate extending in the first and third directions D1 and D3. The plate node PN and the plate line PL may include the same material.

Figure 5A:
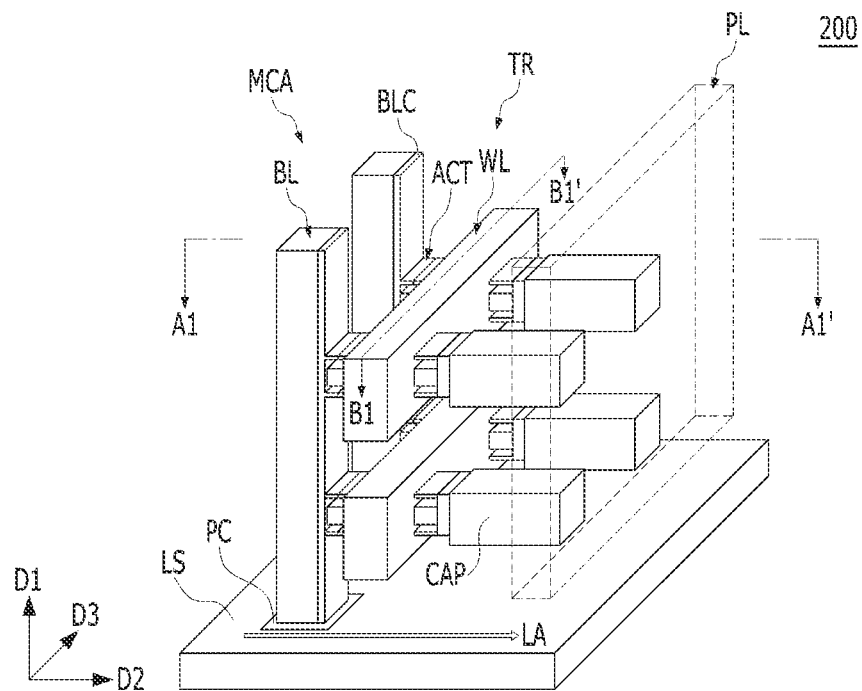
FIG. 5A is a view schematically illustrating a configuration of a memory device according to an embodiment of the present disclosure.
Figure 5B:
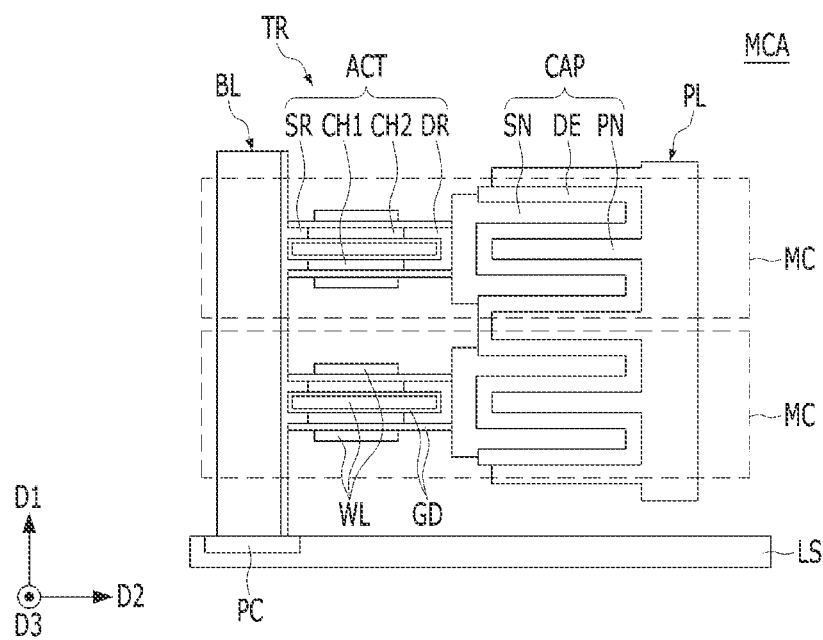
FIG. 5B is a cross-sectional view taken along line A1-A1' of FIG. 5A.
Figure 5C:
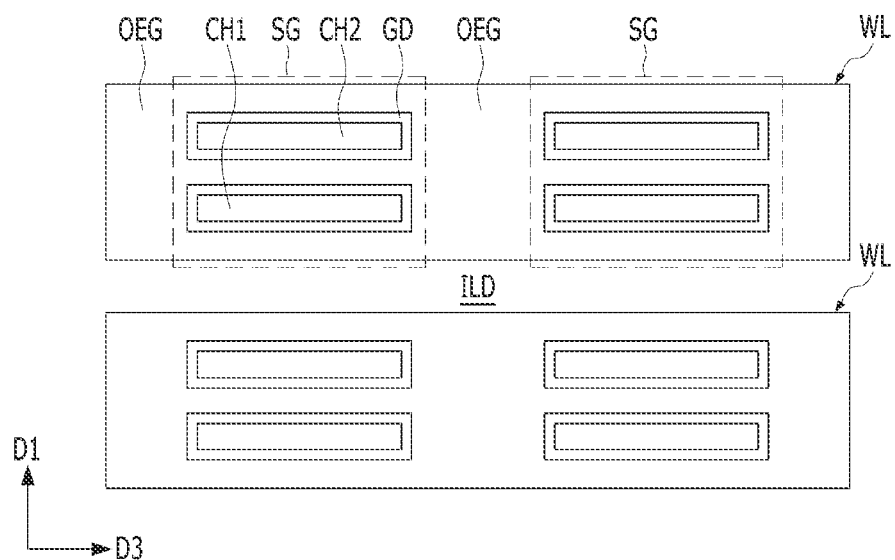
FIG. 5C is a cross-sectional view taken along line B1-B1' of FIG. 5A.

FIG. 5A is a view schematically illustrating a configuration of a memory device according to an embodiment of the present disclosure. FIG. 5B is a cross-sectional view taken along line A1-A1' of FIG. 5A. FIG. 5C is a cross-sectional view taken along line B1-B1' of FIG. 5A. In FIGS. 5A to 5C, the same reference numbers are used to denote the same elements as those in FIGS. 1 to 4B. Detailed description may be omitted for same elements already described. The memory device 200 illustrated in FIGS. 5A to 5C may include an array of memory cells MC as illustrated in FIG. 1.

Referring to FIGS. 5A to 5C, the memory device 200 may include a substrate structure LS, and a memory cell array MCA formed on the substrate structure LS. The memory cell array MCA may be vertically oriented from the substrate structure LS along the first direction D1. The memory cell array MCA may include a plurality of memory cells MC. The memory cell array MCA may include a column array of memory cells MC and a row array of memory cells MC. A bit line BL may be coupled to the memory cells MC of the column array, and a word line WL may be coupled to the memory cells of the row array. In the embodiment illustrated in FIGS. 5A to 5C, the memory cell array MCA may include four memory cells MC. Each memory cell MC may include a bit line BL, a transistor TR, and a capacitor CAP. Each memory cell MC may further include a word line WL extending along the third direction D3. The word line WL may be disposed in the area between the capacitor CAP and the bit line BL. In each memory cell MC, the bit line BL, the transistor TR, and the capacitor CAP may be positioned in a lateral array (LA) along the second direction D2 with the transistor TR positioned between the bit line BL and the capacitor CAP.

The memory cell array MCA may include a stack of memory cells MC. The memory cells MC may be vertically stacked on the substrate structure LS along the first direction D1. Referring to FIG. 5A, the memory cell array MCA may include memory cells horizontally arrayed along the third direction D3.

Each memory cell MC may include a bit line BL, a transistor TR, a capacitor CAP, and a plate line PL. The transistor TR may be according to the transistor TR described. The transistor TR may include an active layer ACT and a word line WL. The word line WL may include a hybrid gate-all-around (GAA) structure. The transistor TR may include a lateral transistor. The transistor TR may include a gate-all-around (GAA) transistor. The active layer ACT may be horizontally oriented along the second direction D2 from the bit line BL. The word line WL may be horizontally oriented along the third direction D3 perpendicular to the first direction D1 and the second direction D2. The active layer ACT may include a first doped portion SR, a second doped portion DR, and at least one channel portion CH1 and CH2 positioned between the first doped portion SR and the second doped portion DR. A bit line contact node BLC may be positioned between the bit line BL and the first doped portion SR. The bit line contact node BLC and the first doped portion SR may include the same material.

The transistor TR may be positioned between the bit line BL and the capacitor CAP. The transistor TR may be horizontally arranged (LA) along the second direction D2 parallel with the surface of the substrate structure LS. That is, the transistor TR may be horizontally positioned between the bit line BL and the capacitor CAP.

The bit line BL may extend from the substrate structure LS along the first direction D1. The plane of the substrate structure LS may be provided by the second direction D2 and the third direction D3. The bit line BL may be vertically oriented from the substrate structure LS. The bit line BL may directly contact the substrate structure LS. For example, the bottom portion of the bit line BL may directly contact the peripheral circuit portion PC formed on the substrate structure LS. The bit line BL may have a pillar shape that is vertically elevated. The bit line BL may have a rectangular cross section, however, it should be understood that the invention may not be limited in this way. The bit line BL may also be referred to as a vertically oriented bit line or pillar-shaped bit line. The memory cells MC vertically stacked on top of each other along the first direction D1 may share one bit line BL.

The word line WL may extend along the third direction D3 while surrounding the active layer ACT. The memory cells MC arrayed horizontally at the same vertical level along the third direction D3 may share one word line WL. The word lines WL of the memory cells stacked along the first direction D1 may be vertically spaced apart from each other. An insulation layer ILD may be positioned between the vertically spaced word lines WL.

The capacitors of the memory cells stacked along the first direction D1 may share the plate line PL. Further, the capacitors of the memory cells arrayed horizontally along the third direction D3 may share the plate line PL. The plate line PL may mutually connect the plate nodes PN and be spaced apart from the substrate structure LS and vertically extend along the first direction D1.

Figure 6:
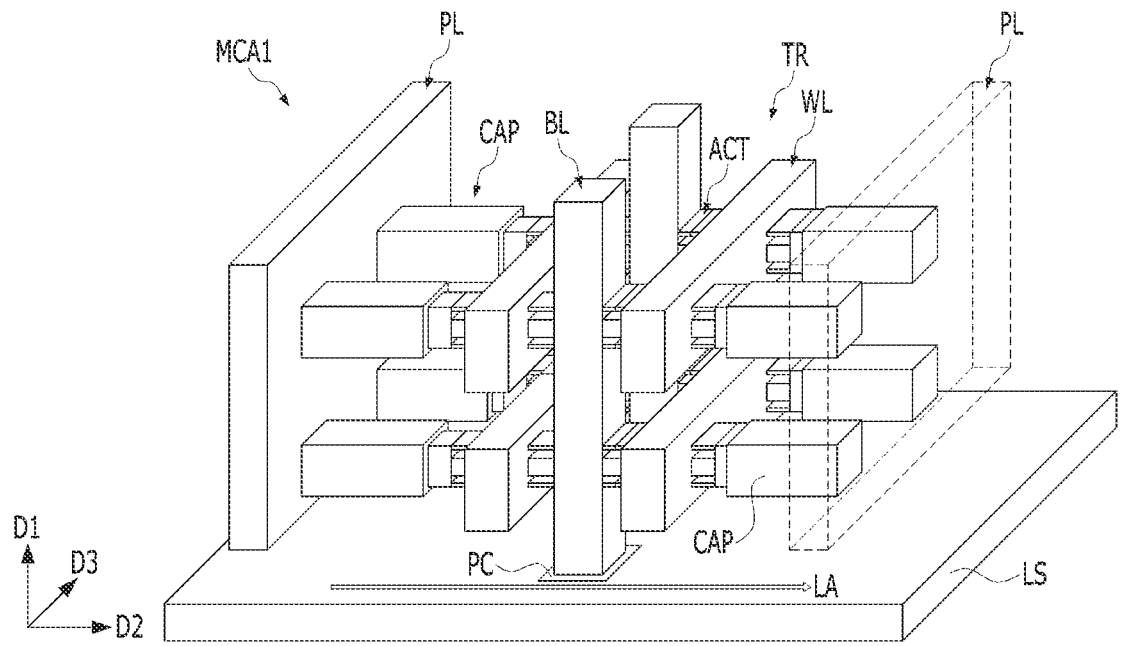
FIG. 6 is a view illustrating a mirror-type memory cell array sharing a bit line.
Figure 7:
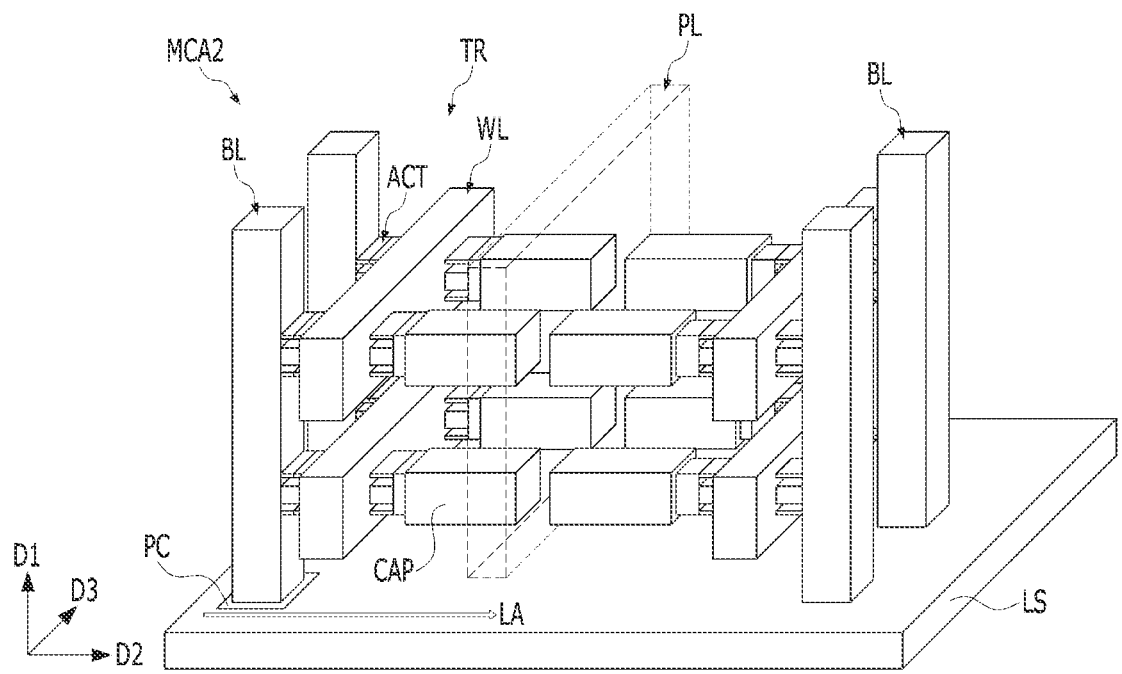
FIG. 7 is a view illustrating a mirror-type memory cell array sharing a plate line.

FIG. 6 is a view illustrating a mirror-type memory cell array sharing a bit line. FIG. 7 is a view illustrating a mirror-type memory cell array sharing a plate line. FIGS. 6 and 7 illustrate application examples of the memory cell array MCA of the memory device 200.

Referring to FIG. 6, a mirror-type memory cell array MCA1 sharing the bit line BL is described. The memory cells MC arrayed horizontally along the second direction D2 may be arrayed in a mirror-type structure in which they are connected to different plate lines PL while sharing one bit line BL.

Referring to FIG. 7, a mirror-type memory cell array MCA2 sharing the plate line PL is described. The memory cells MC arrayed along the second direction D2 may be arrayed in a mirror-type structure in which they are connected to different bit lines BL while sharing one plate line PL.

According to another embodiment, the memory device may include both a mirror-type memory cell array MCA1 sharing the bit line BL and a mirror-type memory cell array MCA2 sharing the plate line PL.

The mirror-type memory cell arrays MCA1 and MCA2 may be positioned higher than the substrate structure LS and the peripheral circuit portion PC. The bit lines BL of the mirror-type memory cell arrays MCA1 and MCA2 may be connected to the peripheral circuit portion PC.

Figure 8A:
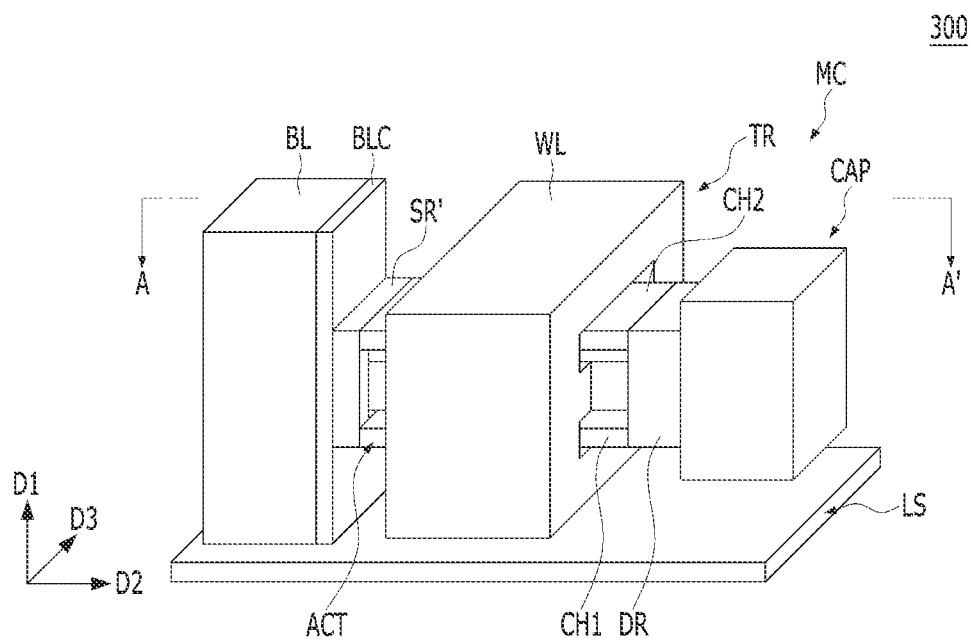
FIG. 8A is a view schematically illustrating a configuration of a memory device according to an embodiment of the present disclosure.
Figure 8B:
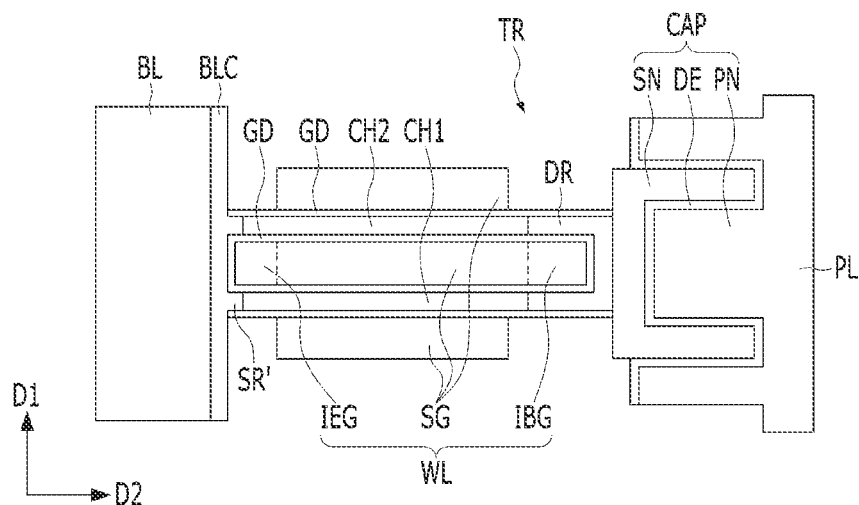
FIG. 8B is a cross-sectional view taken along line A-A' of FIG. 8A.

FIG. 8A is a view schematically illustrating a configuration of a memory device according to an embodiment of the present disclosure. FIG. 8B is a cross-sectional view taken along line A-A' of FIG. 8A. The memory device 300 may include components similar to those of FIGS. 1 to 4B. In FIGS. 8A and 8B, the same reference numbers are used to denote the same elements as those in FIGS. 1 to 4B. Detailed description of same elements previously described may be omitted.

Referring to FIGS. 8A and 8B, the memory device 300 may include a memory cell MC positioned on a substrate structure LS. The memory cell MC may include a bit line BL, a transistor TR, and a capacitor CAP. The bit line BL may be oriented vertically from the substrate structure LS along a first direction D1. The transistor TR may be oriented horizontally from the bit line BL along a second direction D2. The capacitor CAP may be oriented horizontally from the transistor TR along the second direction D2. The transistor TR may include a word line WL horizontally oriented along a third direction D3.

The transistor TR may include a gate-all-around (GAA) transistor. The transistor TR may include an active layer ACT and a word line WL. The active layer ACT may be horizontally oriented from the bit line BL along the second direction D2. The word line WL may be horizontally oriented along the third direction D3 perpendicular to the first direction D1 and the second direction D2. The active layer ACT may include a first doped portion SR', a second doped portion DR, and at least one channel portion CH1 and CH2 positioned between the first doped portion SR' and the second doped portion DR. The first doped portion SR' may provide a first edge of the active layer ACT, and the second doped portion DR may provide a second edge of the active layer ACT.

The first doped portion SR' may be connected to the bit line BL via a bit line contact node BLC positioned between the bit line BL and the first doped portion SR'. The bit line contact node BLC and the first doped portion SR' may include the same material. For example, the bit line contact node BLC and the first doped portion SR' may include doped polysilicon, and the doped polysilicon may include polysilicon doped with an N-type impurity. Alternatively, the first doped portion SR' may include first doped polysilicon. The bit line contact node BLC may include a stack of second doped polysilicon and metal silicide. The second doped polysilicon may be connected to the first doped portion SR', and the metal silicide may be connected to the bit line BL. According to an embodiment, the bit line contact node BLC and the first doped portion SR' may have an integral structure including a single layer of doped polysilicon. The first doped portion SR' may be connected to the first edge of the channel portions CH1 and CH2. An ohmic contact layer, such as of metal silicide, may be further formed between the bit line BL and the bit line contact node BLC.

The second doped portion DR may be connected to a storage node SN of the capacitor CAP. Referring to FIG. 3, the second doped portion DR may include an opened side surface DR1 connected to the channel portions CH1 and CH2. The second doped portion DR may include a closed side surface DR2 connected to the storage node SN of the capacitor. The second doped portion DR may be connected to the second edge of the channel portions CH1 and CH2. The second doped portion DR may be shaped, for example, as a cylinder and may be horizontally oriented along the second direction D2. For example, the opened side surface DR1 of the second doped portion DR may correspond to an entrance of the cylinder, and the closed side surface DR2 of the second doped portion DR may correspond to the bottom of the cylinder. The second doped portion DR may further include an outer wall DR3 between the opened side surface DR1 and the closed side surface DR2. An inner gap IG may be defined by the outer wall DR3 and the closed side surface. The inner gap IG may also be referred to as a recess portion.

The channel portions CH1 and CH2 may be horizontally oriented along the second direction D2. The channel portions CH1 and CH2 may be horizontally oriented along the second direction D2, between the first doped portion SR and the second doped portion DR. The channel portions CH1 and CH2 may each be formed as a horizontal flat plate. The length of the channel portions CH1 and CH2, along the second direction D2, may be larger than the length of the channel portions CH1 and CH2, along the third direction D3. The channel portions CH1 and CH2 may also be referred to as nanosheets or nanosheet channels. Since the channel portions CH1 and CH2 are horizontally oriented along the second direction D2, the channel portions CH1 and CH2 may also be referred to as 'lateral nanosheets.' The channel portions CH1 and CH2 may include at least two channel portions, e.g., a first channel portion CH1 and a second channel portion CH2. The first channel portion CH1 and the second channel portion CH2 may be arranged vertically along the first direction D1. The space between the first channel portion CH1 and the second channel portion CH2 may be filled with a portion of the word line WL. The thickness of the first channel portion CH1 may be identical to the thickness of the second channel portion CH2. The thickness refers to a thickness along the first direction D1.

Referring to FIGS. 2A, 4A, 4B, and 8B, the word line WL may include a surrounding portion SG surrounding the channel portions CH1 and CH2. The word line WL may further include an inner extension portion (IEG) that horizontally extends from a first side surface of the surrounding portion SG along the second direction D2. The inner extension portion IEG may be positioned near the first doped portion SR'. The word line WL may further include an inner buried portion IBG that horizontally extends from a second side surface of the surrounding portion SG along the second direction D2. The inner buried portion IBG may fill the inner gap IG of the second doped portion DR. The surrounding portion SG may also be referred to as a surrounding gate electrode, and the inner buried portion IBG may also be referred to as a buried gate electrode. The inner extension portion IEG and the inner buried portion IBG may be positioned in the space between the first channel portion CH1 and the second channel portion CH2. The surrounding portion SG, the inner extension portion IEG, and the inner buried portion IBG may be integrally formed to be connected with one another. The surrounding portion SG may also be referred to as a gate-all-around (GAA). The length of the surrounding portion SG along the second direction D2 may be larger than the length of the inner extension portion IEG and the inner buried portion IBG along the second direction D2. Alternatively, the length of the surrounding portion SG along the second direction D2 may be identical to the length of the inner extension portion IEG and the inner buried portion IBG along the second direction D2. The word line WL may further include outer extension portions OEG that extend from the surrounding portion SG along the third direction D3. The outer extension portions OEG may not surround the channel portions CH1 and CH2. The inner extension portion IEG and the inner buried portion IBG may not surround the channel portions CH1 and CH2 either. The inner extension portion IEG, inner buried portion IBG, and outer extension portions OEG may be collectively referred to as a 'non-surrounding portion.'

The word line WL may include a hybrid gate-all-around (GAA) structure. The hybrid GAA structure may include the surrounding portion SG and the inner buried portion IBG.

A gate insulation layer GD may be formed between the word line WL and the channel portions CH1 and CH2. A portion of the gate insulation layer GD may be formed between the inner buried portion IBG and the second doped portion DR. A portion of the gate insulation layer GD may be formed between the inner extension portion IEG and the first doped portion SR'. The gate insulation layer GD may surround the channel portions CH1 and CH2. The surrounding portion SG of the word line WL may surround the channel portions CH1 and CH2, with the gate insulation layer GD disposed therebetween. The gate insulation layer GD may be shaped to conformally surround the channel portions CH1 and CH2. The gate insulation layer GD may include silicon oxide, silicon nitride, silicon oxynitride, high-k material, or a combination thereof.

The capacitor CAP may be horizontally disposed adjacent to the transistor TR. The capacitor CAP may be oriented horizontally along the second direction D2. The capacitor CAP may include a storage node SN, a dielectric layer DE, and a plate node PN. The storage node SN, the dielectric layer DE, and the plate node PN may be horizontally arranged along the second direction D2. The storage node SN may be shaped, for example, as a cylinder and may be horizontally oriented, and the plate node PN may be shaped to surround the cylinder of the storage node SN. The dielectric layer DE may be shaped to cover the surface of the cylinder of the storage node SN. The plate node PN may connect to the plate line PL. Alternatively, the plate node PN and the plate line PL may be integrally formed with each other, and the plate node PN may be part of the plate line PL.

The storage node SN may have a three-dimensional (3D) structure, and the 3D structure of the storage node SN may be a horizontal 3D structure along the second direction D2. As an example of the 3D structure, the storage node SN may have a cylinder shape, a pillar shape, or a pylinder shape resultant from merging a pillar shape and a cylinder shape. In the illustrated embodiment, the storage node SN may be shaped as a cylinder. The dielectric layer DE may be formed between the storage node SN and the plate node PN. The dielectric layer DE may directly contact the plate node PN.

The first doped portion SR' may have a cross section shaped as a rectangular ring along the first direction D1. The cross section of the first doped portion SR' along the first direction D1 may be shaped as a circular ring, an oval ring, or a polygonal ring. The first doped portion SR' may surround the inner extension portion IEG of the word line WL. The first doped portion SR' may contact the bit line contact node BLC. The first doped portion SR' and the bit line contact node BLC may include an integral single layer or different materials.

Figure 9A:
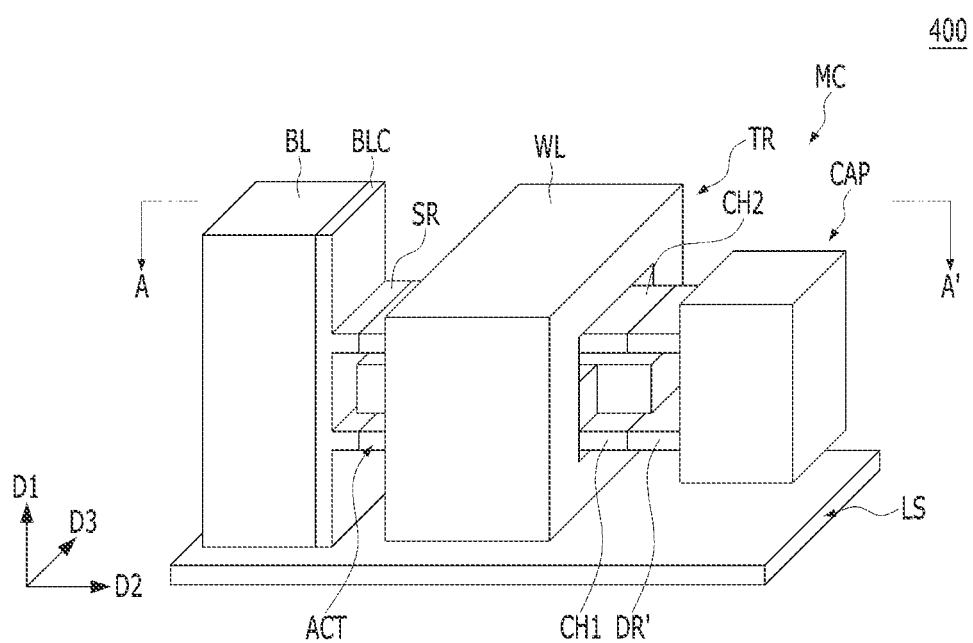
FIG. 9A is a view schematically illustrating a configuration of a memory device according to an embodiment of the present disclosure.
Figure 9B:
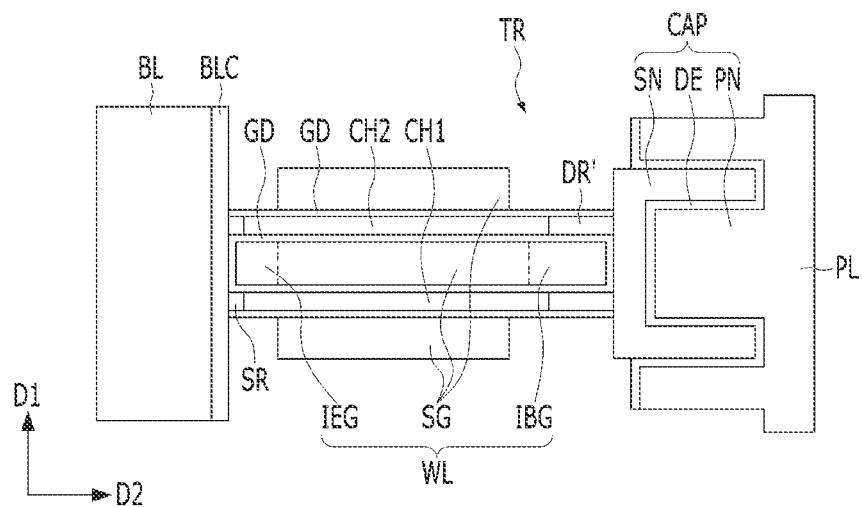
FIG. 9B is a cross-sectional view taken along line A-A' of FIG. 9A.

FIG. 9A is a view schematically illustrating a configuration of a memory device according to an embodiment of the present disclosure. FIG. 9B is a cross-sectional view taken along line A-A' of FIG. 9A. The memory device 400 may include components similar to those of FIGS. 1 to 4B. In FIGS. 9A and 9B, the same reference numbers are used to denote the same elements as those in FIGS. 1 to 4B. Detailed description of same elements previously described may be omitted.

Referring to FIGS. 9A and 9B, the memory device 400 may include a memory cell MC. The memory cell MC may be positioned on a substrate structure LS. The memory cell MC may include a bit line BL, a transistor TR, and a capacitor CAP. The bit line BL may be oriented vertically along a first direction D1 from the substrate structure LS. The transistor TR may be oriented horizontally along a second direction D2, which is perpendicular to the first direction D1, from the bit line BL. The capacitor CAP may be oriented horizontally along the second direction D2 from the transistor TR. The transistor TR may include a word line WL horizontally oriented along a third direction D3.

The transistor TR may include a gate-all-around (GAA) transistor. The transistor TR may include an active layer ACT and a word line WL. The active layer ACT may be horizontally oriented along the second direction D2 from the bit line BL. The word line WL may be horizontally oriented along the third direction D3 perpendicular to the first direction D1 and the second direction D2. The active layer ACT may include a first doped portion SR, a second doped portion DR', and at least one channel portion CH1 and CH2. The at least one channel portion CH1 and CH2 may be positioned between the first doped portion SR and the second doped portion DR'. The first doped portion SR may provide a first edge of the active layer ACT, and the second doped portion DR' may provide a second edge of the active layer ACT.

The first doped portion SR may be connected to the bit line BL. A bit line contact node BLC may be positioned between the bit line BL and the first doped portion SR.

The second doped portion DR' may be connected to the capacitor CAP. The second doped portion DR' may be connected to a storage node SN of the capacitor CAP. The second doped portion DR' may horizontally extend from the channel portions CH1 and CH2 along the second direction D2. An upper-level second doped portion DR' and a lower-level second doped portion DR' may be spaced apart from each other along the first direction D1.

The channel portions CH1 and CH2 may be horizontally oriented along the second direction D2. The channel portions CH1 and CH2 may be horizontally oriented along the second direction D2, between the first doped portion SR and the second doped portion DR'. The channel portions CH1 and CH2 may each be formed as a horizontal flat plate. The length of the channel portions CH1 and CH2, along the second direction D2, may be larger than the length of the channel portions CH1 and CH2, along the third direction D3. The channel portions CH1 and CH2 may also be referred to as nanosheets or nanosheet channels. Since the channel portions CH1 and CH2 are horizontally oriented along the second direction D2, the channel portions CH1 and CH2 may also be referred to as 'lateral nanosheets.' The channel portions CH1 and CH2 may include at least two channel portions, e.g., a first channel portion CH1 and a second channel portion CH2. The first channel portion CH1 and the second channel portion CH2 may be arranged vertically along the first direction D1. The space between the first channel portion CH1 and the second channel portion CH2 may be filled with a portion of the word line WL.

The first doped portion SR and the second doped portion DR' each may have a nanosheet shape.

Memory cells 300 and 400 as illustrated in FIGS. 8A to 9B may configure a memory cell array, and the array of memory cells 300 and 400 may be similar to the memory cell arrays shown in FIGS. 5A to 7.

Figure 10:
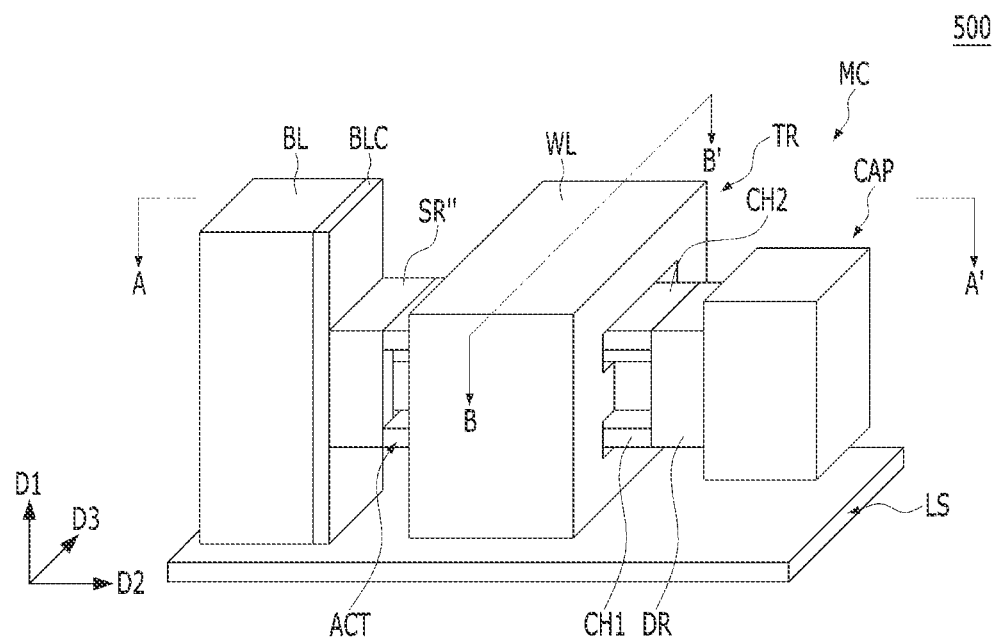
FIG. 10 is a view schematically illustrating a configuration of a memory device according to an embodiment of the present disclosure.
Figure 11A:
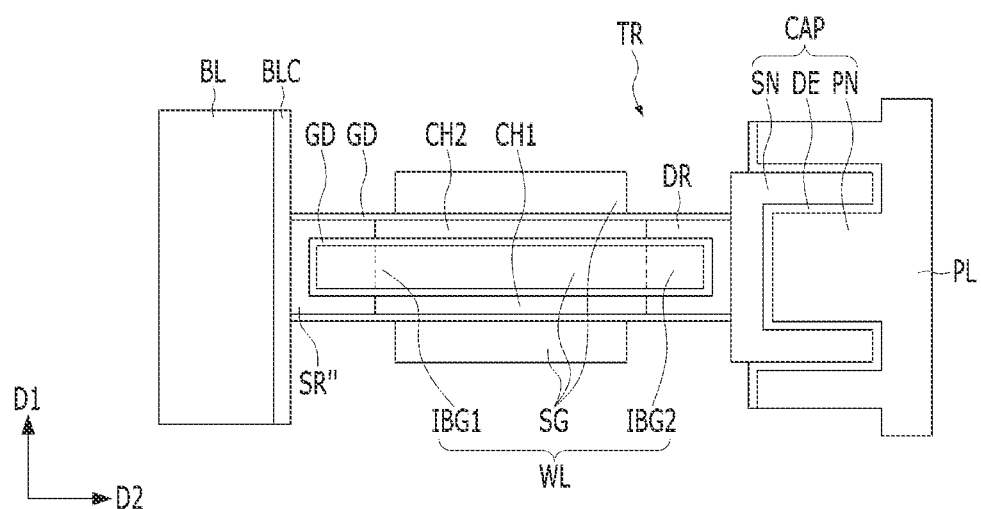
FIG. 11A is a cross-sectional view taken along line A-A' of FIG. 10.
Figure 11B:
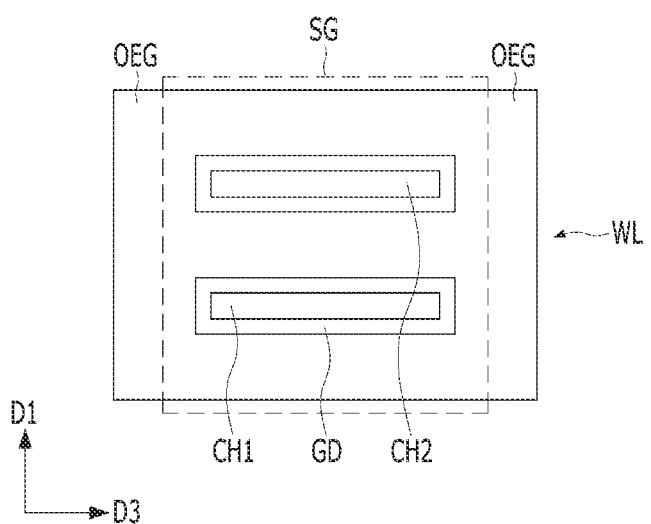
FIG. 11B is a cross-sectional view taken along line B-B' of FIG. 10.
Figure 12:
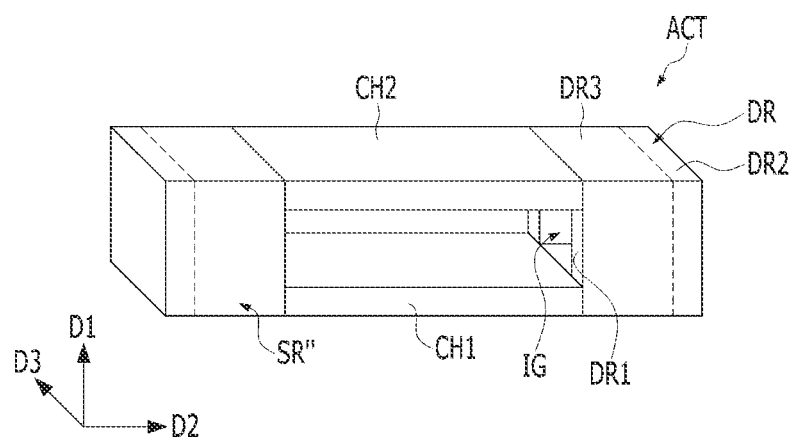
FIG. 12 is a view illustrating, in detail, an active layer ACT of FIG. 10.
Figure 13:
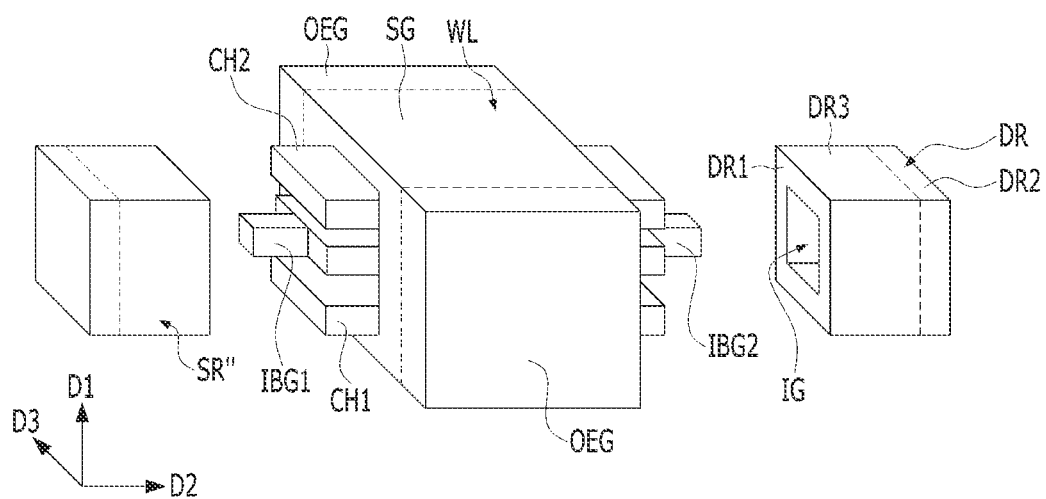
FIG. 13 is an exploded perspective view illustrating an arrangement of word lines WL and active layers ACT.

FIG. 10 is a perspective view schematically illustrating a configuration of a memory cell according to an embodiment of the present disclosure. FIG. 11A is a cross-sectional view taken along line A-A' of FIG. 10. FIG. 11B is a cross-sectional view taken along line B-B' of FIG. 10. FIG. 12 is a view illustrating, in detail, an active layer ACT of FIG. 10. FIG. 13 is an exploded perspective view illustrating an arrangement of word lines WL and active layers ACT.

In FIGS. 10 to 13, the same reference numbers are used to denote the same elements as those in FIGS. 1A to 1D. The memory device 500 may be similar to the semiconductor device 100 of FIGS. 1 to 4B. No detailed description may be given for duplicate elements.

Referring to FIGS. 10 to 13, the memory device 500 may include a memory cell MC positioned on a substrate structure LS. The memory cell MC may include a bit line BL, a transistor TR, and a capacitor CAP. The bit line BL may be oriented vertically from the substrate structure LS along a first direction D1. The transistor TR may be oriented horizontally from the bit line BL along a second direction D2, which is perpendicular to the first direction D1. The capacitor CAP may be oriented horizontally from the transistor TR along the second direction D2. The transistor TR may include a word line WL horizontally oriented along the third direction D3, at least two channel portions CH1 and CH2, a first doped portion SR", and a second doped portion DR.

The first doped portion SR" may be connected to the bit line BL. The first doped portion SR" may be connected to the first edge of the channel portions CH1 and CH2. The second doped portion DR may be connected to the capacitor CAP. The second doped portion DR may be connected to a storage node SN of the capacitor CAP. Referring back to FIG. 3, the second doped portion DR may include an opened side surface DR1 connected to the channel portions CH1 and CH2. The second doped portion DR may include a closed side surface DR2 connected to the storage node SN of the capacitor. The second doped portion DR may be connected to the second edge of the channel portions CH1 and CH2. The second doped portion DR may be shaped, for example, as a cylinder and may be horizontally oriented along the second direction D2. For example, the opened side surface DR1 of the second doped portion DR may correspond to an entrance of the cylinder, and the closed side surface DR2 of the second doped portion DR may correspond to the bottom of the cylinder. The second doped portion DR may further include an outer wall DR3 between the opened side surface DR1 and the closed side surface DR2. An inner gap IG may be defined by the outer wall DR3 and the closed side surface. The inner gap IG may also be referred to as a recess portion. Like the second doped portion DR, the first doped portion SR" may include an opened side surface connected to the channel portions CH1 and CH2 and a closed side surface connected to the bit line BL. The first doped portion SR" may be shaped, for example, as a cylinder and may be horizontally oriented along the second direction D2 and may include an inner gap. The first doped portion SR" may also be referred to as a first cylinder, and the second doped portion DR may also be referred to as a second cylinder. The first doped portion SR", the channel portions CH1 and CH2, and the second doped portion DR may configure an integral active layer. The bit line contact node BLC and the first doped portion SR" may include the same or different materials.

The first doped portion SR" and the second doped portion DR, respectively, may be connected to both edges of the channel portions CH1 and CH2. The first doped portion SR" and the second doped portion DR may each be shaped, for example, as a cylinder and may be horizontally oriented and face each other, with the channel portions CH1 and CH2 disposed therebetween.

The channel portions CH1 and CH2 may be horizontally oriented along the second direction D2 between the first doped portion SR" and the second doped portion DR. The channel portions CH1 and CH2 may each be formed as a horizontal flat plate. The length of the channel portions CH1 and CH2, along the second direction D2, may be larger than the length of the channel portions CH1 and CH2, along the third direction D3. The channel portions CH1 and CH2 may also be referred to as nanosheets or nanosheet channels. Since the channel portions CH1 and CH2 are horizontally oriented along the second direction D2, the channel portions CH1 and CH2 may also be referred to as 'lateral nanosheets.' The channel portions CH1 and CH2 may include at least two channel portions, e.g., a first channel portion CH1 and a second channel portion CH2. The first channel portion CH1 and the second channel portion CH2 may be arranged vertically along the first direction D1. The space between the first channel portion CH1 and the second channel portion CH2 may be filled with a portion of the word line WL. The thickness of the first channel portion CH1 may be identical to the thickness of the second channel portion CH2. The thickness refers to a thickness along the first direction D1.

The word line WL may include a surrounding portion SG surrounding the channel portions CH1 and CH2. The word line WL may further include a first inner buried portion IBG1 and a second inner buried portion IBG2 that horizontally extend from a first side surface of the surrounding portion SG along the second direction D2. The first inner buried portion IBG1 may fill the inner gap of the first doped portion SR", and the second inner buried portion IBG2 may fill the inner gap IG of the second doped portion DR. The surrounding portion SG may also be referred to as a surrounding gate electrode, and the first and second inner buried portions IBG1 and IBG2 may also be referred to as a buried gate electrode. The surrounding portion SG, the first inner buried portion IBG1, and the second inner buried portion IBG2 may be integrally formed to be connected with one another. The surrounding portion SG may also be referred to as a gate-all-around (GAA). The length of the surrounding portion SG along the second direction D2 may be larger than the length of the first inner buried portion IBG1 and the second inner buried portion IBG2 along the second direction D2. Alternatively, the length of the surrounding portion SG along the second direction D2 may be identical to the length of the first inner buried portion IBG1 and the second inner buried portion IBG2 along the second direction D2. The word line WL may further include outer extension portions OEG that extend from the surrounding portion SG along the third direction D3. The outer extension portions OEG may not surround the channel portions CH1 and CH2. The first inner buried portion IBG1 and the second inner buried portion IBG2 may not surround the channel portions CH1 and CH2 either. The first inner buried portion IBG1, the second inner buried portion IBG2, and the outer extension portions OEG may be collectively referred to as a 'non-surrounding portion.'

The word line WL may include a hybrid gate-all-around (GAA) structure. The hybrid GAA structure may include the surrounding portion SG and the inner buried portions IBG1 and IBG2.

Memory cells 500 as illustrated in FIGS. 10 to 13 may configure a memory cell array, and the array of memory cells 500 may be similar to the memory cell arrays shown in FIGS. 5A to 7. The array of memory cells 500 may be positioned higher than the substrate structure LS and the peripheral circuit portion PC, and the bit lines BL of the array of memory cells 500 may be connected to the peripheral circuit portion PC. Alternatively, the array of memory cells 500 may be positioned lower than the substrate structure LS and the peripheral circuit portion PC, and the bit lines BL of the array of memory cells 500 may be connected to the peripheral circuit portion PC.

In the above-described embodiments, the word line WL having a gate-all-around structure may electrically shield two channel portions CH1 and CH2 from the word lines of the memory cells vertically neighboring each other.

It is apparent to one of ordinary skill in the art that the memory devices according to various embodiments of the present disclosure as described above are not limited to the above-described embodiments and those shown in the drawings, and various changes, modifications, or alterations may be made thereto without departing from the scope of the present disclosure.

The above described embodiments of the present invention are intended to illustrate and not to limit the present invention. Various alternatives and equivalents are possible. The invention is not limited by the embodiments described herein. Nor is the invention limited to any specific type of memory device. Other additions, subtractions, or modifications which are obvious in view of the present disclosure, are intended to fall within the scope of the appended claims.

What is claimed is:

1. A memory cell, comprising:
a substrate;
a bit line vertically oriented from the substrate along a first direction;
a nanosheet transistor including at least one nanosheet of a pair of nanosheets horizontally oriented from the bit line along a second direction perpendicular to the first direction; and
a capacitor horizontally oriented from the nanosheet transistor along the second direction,
wherein the nanosheet transistor includes the pair of nanosheets spaced apart from each other along the first direction, and horizontally oriented from the bit line along the second direction.

2. The memory cell of claim 1, wherein the at least one nanosheet of the pair of nanosheets includes a monocrystalline semiconductor material, a polycrystalline semiconductor material, an oxide semiconductor, or a metal compound.

3. The memory cell of claim 1, wherein the at least one nanosheet of the pair of nanosheets includes a polysilicon nanosheet, a monocrystalline silicon nanosheet, or indium gallium zinc oxide (IGZO).

4. The memory cell of claim 1, wherein the pair of nanosheets includes:
a first nanosheet; and
a second nanosheet spaced apart from the first nanosheet along the first direction, and wherein a horizontal length of the first nanosheet, along the second direction, is identical to a horizontal length of the second nanosheet, along the second direction.

5. The memory cell of claim 1, wherein the pair of nanosheets includes a pair of polysilicon nanosheets spaced apart from each other along the first direction and horizontally oriented from the bit line along the second direction.

6. The memory cell of claim 1, wherein the nanosheet transistor further includes:
a word line extending along a third direction perpendicular to the first direction and the second direction while surrounding the pair of nanosheets; and
a gate insulation layer positioned between the pair of nanosheets and the word line, and surrounding the at least one pair of nanosheets.

7. The memory cell of claim 6, wherein the word line includes:
a surrounding portion surrounding the at least one nanosheet of the pair of nanosheets; and
an extension portion extending from the surrounding portion along the third direction, and
wherein the extension portion does not surround the at least one nanosheet.

8. The memory cell of claim 6, wherein the word line includes a metal-base material.

9. The memory cell of claim 1, wherein the bit line includes a metal-base material.

10. The memory cell of claim 1, wherein the capacitor includes:
a cylindrical storage node connected to an end of the nanosheet transistor and horizontally oriented along the second direction;
a dielectric layer on the cylindrical storage node; and
a plate node on the dielectric layer.

11. The memory cell of claim 1, further comprising:
a first doped portion horizontally extending from a first side of the at least one nanosheet of the pair of nanosheets; and
a second doped portion horizontally extending from a second side of the at least one nanosheet and connected to the capacitor.

12. A memory cell, comprising: a substrate;
a bit line vertically oriented from the substrate along a first direction;
a first cylinder horizontally oriented from the bit line along a second direction perpendicular to the first direction;
a second cylinder horizontally spaced apart from the first cylinder;
at least two nanosheets horizontally oriented between the first cylinder and the second cylinder;
a word line buried in the first cylinder and the second cylinder while surrounding the at least two nanosheets; and a capacitor horizontally oriented from the second cylinder along the second direction.

13. The memory cell of claim 12, wherein the word line includes:
a surrounding portion surrounding the at least two nanosheets; and
an extension portion extending from the surrounding portion along a third direction perpendicular to the first direction and the second direction, and
wherein the extension portion does not surround the at least two nanosheets.

14. The memory cell of claim 13, wherein the word line includes:
a first buried portion extending from the surrounding portion to an inside of the first cylinder along the second direction; and
a second buried portion extending from the surrounding portion to an inside of the second cylinder along the second direction, and wherein
the first buried portion and the second buried portion do not surround the at least two nano sheets.

15. The memory cell of claim 12, wherein the word line includes a metal-base material.

16. The memory cell of claim 12, wherein the at least two nanosheets include a monocrystalline semiconductor material, a polycrystalline semiconductor material, an oxide semiconductor, or a metal compound.

17. The memory cell of claim 12, wherein the at least two nanosheets include a polysilicon nanosheet.

18. The memory cell of claim 12, wherein the at least two nanosheets include:
a first nanosheet horizontally oriented along the second direction; and
a second nanosheet spaced apart from the first nanosheet along the first direction and horizontally oriented along the second direction, and wherein
the first nanosheet and the second nanosheet each have a first length along the second direction and a second length along a third direction, the first length larger than the second length.

19. The memory cell of claim 12, wherein at least one of the first cylinder and the second cylinder includes:
an opened first side surface connected to the at least two nanosheets;
a closed second side surface facing the first side surface; and
a plurality of outer walls defining an inner gap between the first side surface and the second side surface.

20. The memory cell of claim 12, wherein the first cylinder and the second cylinder include a source/drain of a transistor.

21. The memory cell of claim 12, wherein the substrate includes a peripheral circuit portion, and wherein the bit line is extending upward or downward from the peripheral circuit portion.

22. The memory cell of claim 12, wherein the at least two nanosheets are vertically arrayed along the first direction.

23. A memory cell, comprising:
a substrate;
a bit line vertically oriented from the substrate along a first direction;
at least two nanosheets horizontally oriented from the bit line along a second direction perpendicular to the first direction;
a word line including a surrounding portion surrounding the at least two nanosheets and a first buried portion, and a second buried portion extending from the surrounding portion along the second direction;
a first doped portion horizontally oriented from a first side of the nanosheets, connected to the bit line, and surrounding the first buried portion;
a second doped portion horizontally oriented from a second side of the nano sheets and surrounding the second buried portion; and
a capacitor horizontally oriented from the second doped portion along the second direction.

24. The memory cell of claim 23, wherein at least one of the first doped portion and the second doped portion has a cylinder shape.

25. The memory cell of claim 23, wherein the first doped portion has a cylinder shape in which the first buried portion is buried, and the second doped portion has a ring shape surrounding an outer wall of the second buried portion.

26. The memory cell of claim 23, wherein the first doped portion has a ring shape surrounding an outer wall of the first buried portion, and the second doped portion has a cylinder shape in which the second buried portion is buried.

27. The memory cell of claim 23, wherein the first doped portion has a cylinder shape in which the first buried portion is buried, and the second doped portion has a cylinder shape in which the second buried portion is buried.

28. The memory cell of claim 23, wherein the at least two nanosheets include a monocrystalline semiconductor material, a polycrystalline semiconductor material, an oxide semiconductor, or a metal compound.

29. A memory device, comprising:
a substrate including a peripheral circuit portion; and
a memory cell array including a plurality of memory cells vertically arrayed along a first direction from the peripheral circuit portion,
wherein each of the plurality of memory cells includes:
a bit line vertically oriented along the first direction;
a nanosheet transistor including at least two nanosheets horizontally oriented from the bit line along a second direction perpendicular to the first direction; and
a capacitor horizontally oriented from the nanosheet transistor along the second direction.

30. The memory device of claim 29, wherein the nanosheet transistor includes:
two nanosheets spaced apart from each other along the first direction and horizontally oriented from the bit line along the second direction;
a first cylindrical source/drain connected to a first side of the two nanosheets;
a second cylindrical source/drain connected to a second side of the two nanosheets;
a word line buried in the first cylindrical source/drain and the second cylindrical source/drain while surrounding the at least two nanosheets; and
a gate insulation layer positioned between the two nanosheets and the word line and surrounding the two nanosheets.

31. The memory device of claim 30, wherein the word line includes:
a surrounding portion surrounding the two nanosheets;
an extension portion extending from the surrounding portion along a third direction; and
buried portions individually extending from the surrounding portion to respective insides of the first cylindrical source/drain and the second cylindrical source/drain along the second direction,
wherein the extension portion and the buried portions do not surround the two nanosheets.

32. The memory device of claim 29, wherein the at least two nanosheets include a monocrystalline semiconductor material, a polycrystalline semiconductor material, an oxide semiconductor, or a metal compound.

* * * * *